United States Patent [19]

Ito

[11] 4,348,110

[45] Sep. 7, 1982

[54] CHARGING CURRENT INTEGRATING TYPE PHOTODETECTORS

[75] Inventor: Tetsuo Ito, Hitachi, Japan

[73] Assignee: Hitachi, Ltd., Tokyo, Japan

[21] Appl. No.: 118,908

[22] Filed: Feb. 6, 1980

[30] Foreign Application Priority Data

Mar. 3, 1979 [JP] Japan .................. 54/24951

[51] Int. Cl.³ .............................. G01J 3/38; G01J 1/46
[52] U.S. Cl. .................................. 356/328; 307/311; 356/215
[58] Field of Search ....................... 356/326, 328, 215; 307/311

[56] References Cited

U.S. PATENT DOCUMENTS

| | | | |
|---|---|---|---|
| 3,547,542 | 12/1970 | Bulpitt et al. | 356/326 X |
| 3,732,491 | 5/1973 | Battista | 356/215 X |
| 3,934,161 | 1/1976 | Caywood | 357/24 X |
| 4,000,418 | 12/1976 | Waldron et al. | 357/24 X |
| 4,146,332 | 3/1979 | Moore | 356/326 X |

OTHER PUBLICATIONS

Weckler, "Operation of p-n Junction Photodetectors in a Photon Flux Integrating Mode", IEEE Journal of Solid-State Circuits, vol. SC-2, No. 3, Sep. 1967, pp. 65–73.

Primary Examiner—Vincent P. McGraw
Attorney, Agent, or Firm—Craig and Antonelli

[57] ABSTRACT

There is provided a photodetector wherein charging current to a photodiode is integrated to determine an amount of discharge due to conduction of photoelectric current through the photodiode and thereby to measure intensity of photon flux incident to the photodiode, so that linearity of light input intensity versus output voltage characteristics can be improved and dynamic range of the measurement can be extended.

9 Claims, 7 Drawing Figures

CHARGING CURRENT INTEGRATING TYPE PHOTODETECTORS

BACKGROUND OF THE INVENTION

1. Field of the Invention

The present invention relates generally to photodetectors and particularly to a charging current integrating type photodetector which can provide a highly linear output relative to its light input intensity.

2. Description of the Prior Art

A photodiode charge storage type photodetector has hitherto been available as a photodetector directed to high speed detection of photon flux. Such a photodetector is disclosed in "Operation of p-n Junction Photodetectors in a Photon Flux Integrating Mode" by Gene P. Weckler, IEEE Journal of Solid-State Circuits, Vol. SC-2, No. 3, September 1967, pp 65-73.

Reference is made to FIG. 1 which is useful to explain the principle of this known photodetector. A switch 1 is turned on at time $t_o$ and a photodiode 2 is charged up to a voltage Vo of a voltage source 3. The photodiode has a junction capacitance C which can be expressed in general by equation (1), $$C = C_o(V + V_d)^{-n} \tag{1}$$

where V is a reverse bias voltage, Vd a diffusion potential, and n a constant which varies within a range of $\frac{1}{2}$ to $\frac{1}{3}$ in accordance with the junction concentration distribution.

When charged with the voltage Vo, the photodiode has a charge $Q_{Vo}$ which is given by equation (2), $$Q_{Vo} = \int_0^{Vo} C dV \tag{2}$$

Equation (2) is then reduced to, $$(C_o/(1-n))[(V_o+V_d)^{(1-n)} - V_d^{(1-n)}] \tag{3}$$

When the photodiode receives the photon flux illumination and a photoelectric current Ip begins to flow through the photodiode pn junction, the charge stored in the junction capacitor is caused to discharge. During time lapse $t_s$ counting from the open-circuit of the switch 1, the stored charge discharges by an amount Qp which is, $$Qp = \int_0^{t_s} \alpha p S dt \tag{4}$$

$$= \alpha p S t_s \tag{5}$$

where $\alpha$ is the sensitivity of the photodiode, p the light input intensity, and S the light receiving area.

It is now assumed that a charged voltage which remains across the photodiode at the termination of the time lapse $t_s$ is denoted by Vt, then equation (6) stands:

$$Q_{Vo} - Qp = \int_0^{Vt} C_o(V + V_d)^{-n} dV \tag{6}$$

$$= C_o/(1-n)[(Vt + V_d)^{(1-n)} - V_d^{(1-n)}]$$

From equations (3), (5) and (6), $$C_o/(1-n)[(V_o + V_d)^{(1-n)} - V_d^{(1-n)}] - \alpha p S t_s = \tag{7}$$

$$C_o/(1-n)[(Vt + V_d)^{(1-n)} - V_d^{(1-n)}]$$

is obtained which is reduced to, $$Vt = \left[(V_o + V_d)^{(1-n)} - \frac{\alpha p S t_s(1-n)}{C_o}\right]^{1/(1-n)} - V_d \tag{8}$$

Accordingly, a voltage change $\Delta V$ which is due to decrement in the charged voltage of photodiode caused by conduction of the photoelectric current is given by, $$\Delta V = V_o - Vt \tag{9}$$

$$= V_o + V_d - [(V_o + V_d)^{(1-n)} - \alpha p S t_s(1-n)/C_o]^{\frac{1}{1-n}} \tag{10}$$

The switch 1 is again turned on at the termination of the time lapse $t_s$ so that recharging current is passed into the junction capacitor of the photodiode 2, producing an output voltage Vout across an output resistor 4. The output voltage, decreasing exponentially, has a peak value which is equal to $\Delta V$.

Conventionally, the peak value of the output voltage Vout is detected to measure the intensity of the photon flux illumination. However, this peak value depends on Vo, Vd and n as will be seen from equation (10) and fails to make itself duly proportional to the product of incident photon flux intensity p and charge storing time $t_s$, giving rise to bad linearity between light input intensity and output voltage.

SUMMARY OF THE INVENTION

An object of this invention is to provide a photodetector which is immune from the photodiode junction capacitance dependent on voltage and which can improve linearity of the light input intensity versus output voltage characteristics.

Another object of this invention is to provide a spectrophotometer incorporated with the photodetector.

The photoelectric current is independent of the voltage applied across the photodiode and determined by the light receiving area S and the incident photon flux intensity. In other words, sensitivity $\alpha$ of the photodiode is independent of the applied voltage. Also, discharging decrement Qp from the charge stored in the photodiode upon illumination of photon flux is proportional to the product of incident photon flux intensity p and charge storing time $t_s$.

When the switch 1 is again turned on at the termination of lapse of the charge storing time $t_s$, the photodiode is recharged up to the applied voltage Vo with an amount of charge which is exactly equal to the discharging decrement Qp due to conduction of the photoelectric current. Thus, when denoting the charging current by ic, $$\int_0^\infty ic\, dt = Qp \tag{11}$$

stands.

The present invention is featured by the fact that the charging current ic of the photodiode is integrated to determine the discharging decrement Qp due to conduction of the photoelectric current, thereby measuring the incident photon flux intensity p.

DESCRIPTION OF THE PREFERRED EMBODIMENTS

Figure 1:
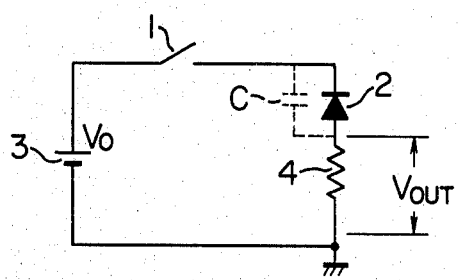
FIG. 1 is a circuit diagram useful to explain the principle of charge storing operation in the diode.
Figure 2:
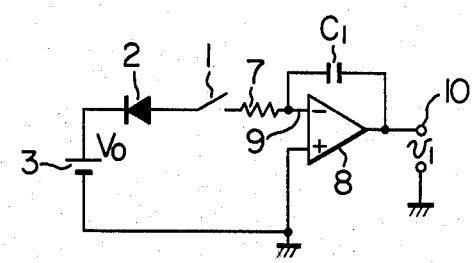
FIG. 2 is a circuit diagram to show one embodiment of the invention.

Referring now to FIG. 2, one embodiment of the invention will be described. In FIG. 2, the same elements as those shown in FIG. 1 are designated by the same reference numerals. This embodiment operates in general in a similar manner to the FIG. 1 circuit but what is essentially different from FIG. 1 resides in the way of measurement of the photon flux intensity in which the charging current of the photodiode is integrated by an integrator. The integrator comprises an operational amplifier 8 and a capacitor C1 of a capacitance C1 connected between an inverting input terminal 9 and an output terminal 10 of the operational amplifier 8, and it integrates charging current ic passed through a resistor 7. One pole of a voltage source 3 and a non-inverting input terminal of the operational amplifier 8 are connected in common to ground. For incident photon flux intensity p, an output voltage $v_1$ of the integrator is given by, $$v_1 = -\frac{1}{C1} \int_0^t i_c \, dt \tag{12}$$

which, when $t \to \infty$, reduces to $$v_1\,t \to \infty = -Q_p/C1 \tag{13}$$

$$= -\alpha p S t_s / C1 \tag{14}$$

It is seen from equation (14) that when integration time t is sufficiently large, the output voltage $v_1$ is made proportional to the product of incident photon flux intensity p and charge storing time $t_s$ to ensure that linearity between the light input intensity versus output voltage characteristic can be improved and measuring errors due to voltage dependency of the photodiode junction capacitance C can be eliminated.

Figure 3:
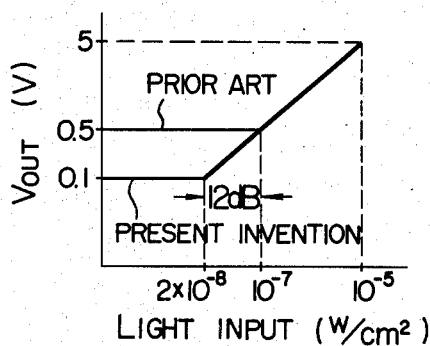
FIG. 3 is a graph to show one example of measurement results of light input intensity versus output voltage characteristics in accordance with the invention and the prior art.

As shown in FIG. 3 which depicts measuring results of the light input intensity versus output voltage characteristics in accordance with the invention and the prior art. As seen from the figure, according to the prior art linearity is obtained in the range of 5-0.5 (V) of the output voltage as well as $10^{-5}$-$10^{-7}$ (W/cm$^2$) of the light input intensity, while according to the present invention is obtained in the range of 5-0.1 (V) of the output voltage as well as $10^{-5}$-$2 \times 10^{-8}$ (W/cm$^2$) of the light input intensity. Thus, the dynamic range of measurement is improved by about 30% (in FIG. 3, from 40 dB to 52 dB).

Figure 4:
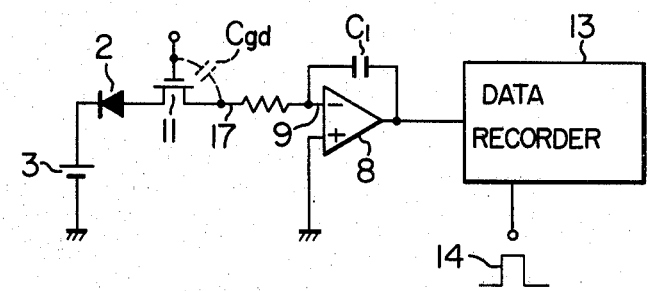
FIG. 4 is a circuit diagram to show another embodiment of the invention.

FIG. 4 shows another embodiment of the invention by designating the same elements as those in FIG. 2 at the same reference numerals. In this embodiment, a MOS transistor 11 is employed as the switching element in order to prolong the lifetime thereof. With the MOS transistor used as the switching element, the switching pulse voltage is differentiated by a gate-drain capacitance $C_{gd}$ of the MOS transistor and a spike current proportional to the differentiated pulse voltage develops on a signal line 17, resulting in a noise signal.

Figure 5:
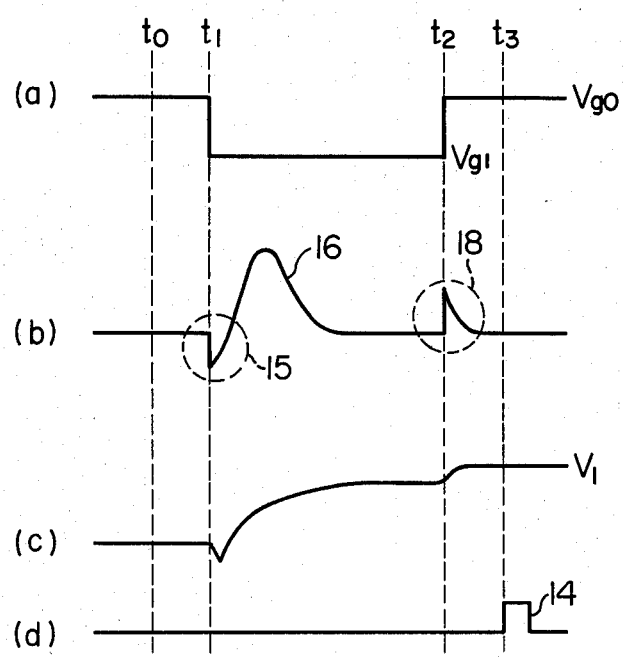
FIG. 5 is a time chart useful to explain signals in the circuit of FIG. 4.

Thus, signal wave forms developing at the time the switching element switches are shown in FIG. 5. Curve (b) in FIG. 5 shows that a negative spike current 15, which is proportional to the falling of a switching pulse of curve (a) applied at time $t_1$ to the gate of the MOS transistor 11, develops at the initial phase of switching and is added to a charging current 16 of the photodiode. The switching pulse then rises at time $t_2$ at which the charging current 16 substantially falls to zero, in order to turn off the switching element. At this instance, a positive spike current 18 which is proportional to the rise of switching pulse develops on the signal line 17. Current $i_s$ developing on the signal line 17 during the period ranging from $t_0$ to $t_3$ at which the positive spike current 18 disappears is integrated in accordance with equations (15) to (18):

$$V1 = \int_{t_0}^{t_3} i_s \, dt \tag{15}$$

$$= \int_{t_0}^{t_3} C_{gd}(dV_g/dt)dt + \int_{t_0}^{t_3} i_c \, dt \tag{16}$$

$$= \int_{V_{g0}}^{V_{g1}} C_{gd} dV_g + \int_{V_{g1}}^{V_{g0}} C_{gd} dV_g + \int_{t_0}^{t_3} i_c \, dt \tag{17}$$

$$= \int_{t_0}^{t_3} i_c \, dt \tag{18}$$

where $C_{gd}$ is the gate-drain capacitance of the MOS transistor, $V_{g0}$ the maximum volue of the switching pulse applied to the gate, $V_{g1}$ the minimum value of the switching pulse, and ic the charging current of the photodiode removed of the spike currents.

As will be seen from equation (18), it is possible to eliminate the noise components 15 and 18 induced on the signal line by the gate-drain capacitance $C_{gd}$ of the MOS transistor 11 by integrating the current on the signal line 17 from $t_0$ to $t_3$. Curve (c) in FIG. 5 shows at V1 the result of the integration. In this manner, only the intrinsic charging current of the photodiode 2 can be detected.

As described above, since the integral of the charging current of the photodiode corresponds to the discharging decrement, due to the photoelectric current conduction upon illumination of photon flux, from the charge which has previously been stored in the photodiode, it is possible to accurately measure incident photon flux intensity without being influenced by the voltage dependency of the junction capacitance. At time t₃, a data recording pulse 14 is generated as shown in FIG. 5 at curve (d) to record the output voltage data in a data recorder 13.

Figure 6:
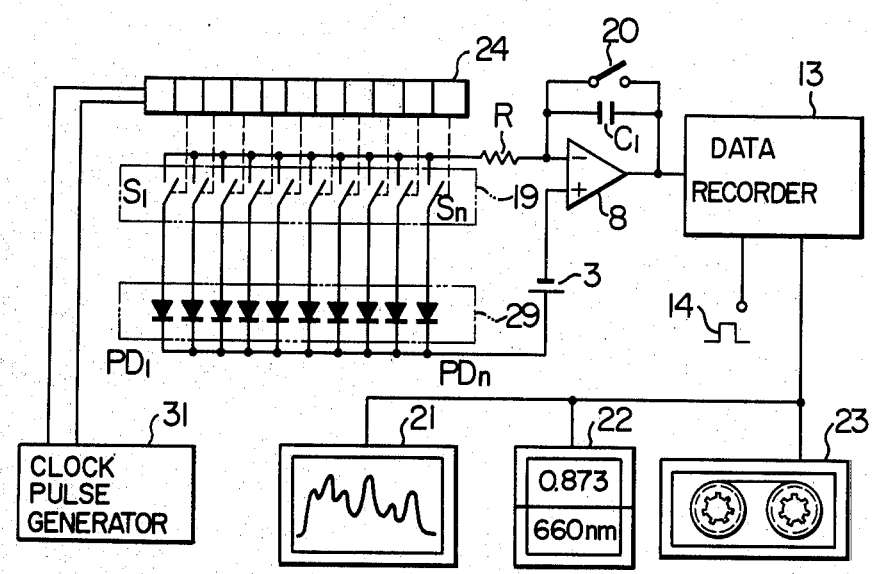
FIG. 6 is a block diagram to show one application of the invention.

FIG. 6 shows further embodiment of the invention. In the figure, the same elements as those in FIG. 4 are designated by the same reference numerals. In this embodiment, a plurality of photodiodes $PD_1$ to $PD_n$ are arrayed with associated switches $S_1$ to $S_n$ connected thereto. A driver circuit 24 is adapted to successively actuate a series of the switches $S_1$ to $S_n$. The driver circuit 24 has output terminals connected to the associated switches $S_1$ to $S_n$. A clock pulse generator 31 for operating the driver circuit 24 is connected as shown in FIG. 6.

Output signals from a photodetector 29 comprised of the photodiode array are passed through an output resistor R to an integrator, which is resettable by actuating a reset switch 20, and integrated thereat. The integrator comprised of an operational amplifier 8 and a capacitor $C_1$ produces an output which is turn is subjected to analog to digital conversion at a data recorder 13 such as for example an MN 7120 of Micro Networks Corporation and recorded therein. Data to be recorded in the recorder 13 are related to wave lengths of 380 nm to 780 nm by using a data recording pulse 14 so that the data can conveniently be plotted on a plotter 21, for example, a 9872A plotter manufactured by Hewlett Packard Corp. with incident photon flux intensities on the ordinate made correspondent with input light wave lengths on the abscissa. The incident photon flux intensity being in correspondence with the wave length is displayed on an indicator 22 using, for example, two light emitting diode digit indicators of 5082-7265 type manufactured by Hewlett Packard Corp. The data recorded in the recorder 13 may be stored using a magnetic recorder 23 such as an MT-2 of TEAC Corp. and derived out thereof, as desired, for display on the plotter 21 or indicator 22.

The analog output of the photodiode array converted into the digital value in accordance with this embodiment is easy to display and record.

Figure 7:
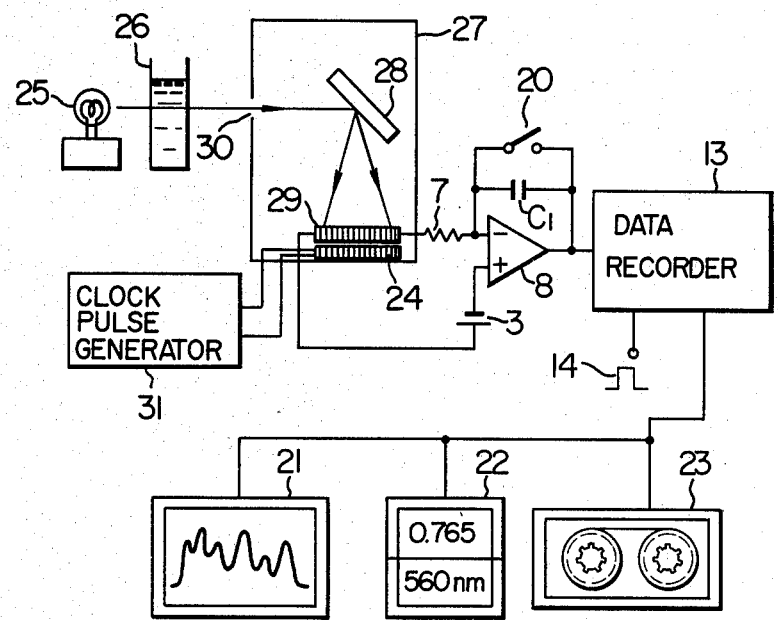
FIG. 7 is a block diagram to show another application of the invention.

The invention is preferably applied to a spectrophotometer as shown in FIG. 7. In an application wherein a photodiode array 29 is used as a photodetector for the spectrophotometer, light emitted from a light source 25 is passed through a sample 26 to be measured and directed to the interior of a spectrometer 27 via an input slit 30 so as to be radiated on a grating 28. The driver circuit 24 and the clock pulse generator 31 are connected to operate the photodiode array 29 and a tungsten lamp or for particular measurement of short wave lengths, and a deuterium lamp is used as the light source 25. The light irradiated on the grating 28 is analyzed thereby into spectra and directed to the array 29 of photodiodes arranged in the order of wave lengths covering short and long wave lengths. Outputs of the photodiode array representative not only of short wave illumination intensity but also of long wave illumination intensity are successively taken out on the time basis, integrated at an integrator comprised of an operational amplifier 8, and recorded in a data recorder 13. An optical system used herein is optically shielded, and the grating 28 and photodiode array 29 taking part in the photodetection are housed in the spectrometer 27 and thus optically shielded from the outside, thereby suppressing measuring errors due to stray light. Data recorded in the recorder 13 are displayed on a plotter 21 or indicator 22 and otherwise stored in a magnetic recorder 23. The data thus stored in the magnetic recorder 23 may be derived out thereof for display, as desired.

In this embodiment, accurate and high speed measurement of the light transmittivity of the sample to be measured is possible.

As has been described, the invention can eliminate non-linear errors in the light detection characteristic due to voltage dependency of the photodiode junction capacitor and provide the highly accurate and high speed photodetector of improved linearity of the light input versus output voltage characteristic.

I claim:

1. A charging current integrating type photodetector comprising:
   a photodiode;
   a power source for applying a reverse bias to said photodiode and charging said photodiode until a charging current flowing to said photodiode becomes steady state;
   a switching element connected in series with the photodiode to permit said charging current to flow to said photodiode when said switching element is turned on and to stop said charging current during a predetermined time in which said switching element is turned off to discharge said photodiode during said predetermined time in accordance with a light intensity to be measured impinging on said photodiode; and
   a current integrator disposed so that said switching element is coupled between said photodiode and said current integrator, said current integrator integrating said charging current at least from at time at which said switching element is again turned on after said predetermined time elapses to a time at which the charging of said photodiode is substantially completed.

2. A photodetector according to claim 1 wherein said switching element comprises a semiconductor switch and the integration covers at least a period extending from a turn-on time of the switching element to a time at which a spike current disappears after the switching element has been turned off, whereby a spike current occurring at said turn-on of said switching element is cancelled by a spike noise occurring at said turn-off of said switching element.

3. A photodetector according to claim 2 wherein said semiconductor switch comprises a MOS transistor.

4. A photodetector according to claim 2 which comprises means for generating a pulse at the disappearance of the spike current and recording data at the output terminal of said current integrator.

5. A photodetector according to claim 1 wherein said current integrator comprises an operational amplifier and a capacitor connected between an inverting input terminal and an output terminal of the operational amplifier whose non-inverting input terminal is grounded, whereby a charging current coming into the inverting input terminal via said photodiode and a resistor is integrated.

6. A charging current integrating type photodetector comprising:
   a plurality of photodiodes arranged in an array;
   a power source for applying a reverse bias to said photodiodes and charging said respective photodiodes until respective charging currents flowing to said photodiode become steady state;

a plurality of switches connected in series with said photodiodes respectively to permit charging currents to flow to each of said photodiodes when a corresponding one of said switches is turned on and to stop each of said charging currents during a predetermined time in which the corresponding one of said switches is turned off to discharge said corresponding photodiodes during said predetermined time in accordance with a light intensity to be measured impinging on said photodiodes;

a drive circuit connected to said switches to successively actuate them;

an integrator for integrating each of said charging currents at least from a time at which the corresponding switch is again turned on after said predetermined time elapses to a time at which the charging of the corresponding photodiode is substantially completed; and display means connected to an output terminal of said integrator, for displaying data from said output terminal.

7. A photodetector according to claim 6 wherein said integrator comprises an operational amplifier, a capacitor connected between its inverting input terminal and output terminal, and a reset switch connected across the capacitor, said integrator being resettable by actuating the reset switch and integrating the diode output coming into said inverting input terminal via an output resistor of the photodiode.

8. A spectrophotometer comprising:

a light source emitting light to be irradiated onto a sample to be measured;

a spectrometer including a grating for analyzing the wave length of light transmitting through said sample and a plurality of photodiodes arranged in an array for detecting light from said grating;

a power source for applying a reverse bias to said photodiodes and charging said respective photodiodes until respective charging currents flowing to said photodiodes become steady state;

a plurality of switches connected in series with said photodiodes respectively to permit charging currents to flow to each of said photodiodes when a corresponding one of said switches is turned on and to stop each of said charging currents during a predetermined time in which the corresponding one of said switches is turned off to discharge said corresponding photodiodes during said predetermined time in accordance with a light intensity of said detection light impinging on said photodiodes;

a drive circuit connected to said switches to successively actuate them;

an integrator for integrating each of said charging currents at least from a time at which the corresponding switch is again turned on after said predetermined time elapses to a time at which the charging of the corresponding photodiode is substantially completed; and display means connected to an output terminal of said integrator, for displaying data from said output terminal.

9. A spectrophotometer according to claim 8 wherein said integrator comprises an operational amplifier, a capacitor connected between its inverting input terminal and output terminal, and a reset switch connected across the capacitor, said integrator being resettable by actuating the reset switch and integrating the diode output coming into said inverting input terminal via an output resistor of the photodiode.

* * * * *